(12) United States Patent
Sasaki et al.

(10) Patent No.: US 7,464,363 B2
(45) Date of Patent: Dec. 9, 2008

(54) VERIFICATION SUPPORT DEVICE, VERIFICATION SUPPORT METHOD, AND COMPUTER PRODUCT

(75) Inventors: Takayuki Sasaki, Kawasaki (JP); Kenji Abe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 111 days.

(21) Appl. No.: 11/504,638

(22) Filed: Aug. 16, 2006

(65) Prior Publication Data

US 2006/0277510 A1    Dec. 7, 2006

Related U.S. Application Data

(63) Continuation of application No. PCT/JP2004/002602, filed on Mar. 3, 2004.

(51) Int. Cl.
*G06F 17/50*    (2006.01)

(52) U.S. Cl. .............................................. 716/18; 716/2

(58) Field of Classification Search ..................... 716/2, 716/18, 1
See application file for complete search history.

(56) References Cited

U.S. PATENT DOCUMENTS

| | | | |
|---|---|---|---|
| 6,904,577 B2 * | 6/2005 | Schubert et al. ................. | 716/4 |
| 7,263,478 B2 * | 8/2007 | Tsuchiya ...................... | 703/14 |
| 2003/0125920 A1 * | 7/2003 | Matsuoka et al. .............. | 703/15 |
| 2004/0015798 A1 * | 1/2004 | Davidson et al. ............... | 716/5 |

FOREIGN PATENT DOCUMENTS

| JP | 2000-258511 | 9/2000 |
|---|---|---|
| JP | 2002-073724 | 3/2002 |
| JP | 2002-73724 | 3/2002 |

OTHER PUBLICATIONS

Office Action issued in corresponding Japanese Patent Application No. 2006-510564, mailed on Jan. 15, 2008.

* cited by examiner

*Primary Examiner*—Jack Chiang
*Assistant Examiner*—Binh C Tat
(74) *Attorney, Agent, or Firm*—Staas & Halsey LLP

(57) ABSTRACT

A verification support device supports logic verification of a design object corresponding to modified sequence diagrams obtained by modifying sequence diagrams expressing processes of a design object in a chronological order. A diagram extracting unit extracts the modified sequence diagrams. A modified process detecting unit detects modified processes by comparing the sequence diagrams before modification and the sequence diagrams after modification. Based on the modified processes, an applicability determining unit determines whether test benches used for a regression test of the design object of the sequence diagrams before modification is applicable to a regression test of the design object of the sequence diagrams after modification. A test bench output unit outputs test benches based on a result of determination by the applicability determining unit.

6 Claims, 13 Drawing Sheets

VERIFICATION SUPPORT DEVICE, VERIFICATION SUPPORT METHOD, AND COMPUTER PRODUCT

CROSS REFERENCE TO RELATED APPLICATIONS

This application is a continuing application, filed under 35 U.S.C. §111(a), of International Application PCT/JP2004/002602, filed Mar. 3, 2004.

BACKGROUND OF THE INVENTION

1. Field of the Invention

The present invention relates to a technology for supporting verification operation in large-scale integration (LSI) designing.

2. Description of the Related Art

In LSI designing, it has conventionally been demanded to improve work efficiency to supply competitive products to the market as early as possible by shortening the design period. On the other hand, verification operation in the design period is indispensable to verify whether the LSI works properly. Especially for an LSI requested to be large in scale, high in performance and speed, and low in power consumption, the verification operation is important to maintain high quality of the LSI.

Conventional verification conducted in a design period will be explained. If one LSI is developed, a successive LSI may be developed by improving the developed LSI (previous LSI). A difference between the successive LSI and the previous LSI is only a part of the circuit and the remaining parts are in common. Generally, in verification of an entire LSI, various tests to verify logics are provided to test the LSI. Therefore, when verifying the entire successive LSI, it is a common practice to reuse the tests conducted on the previous LSI. Specifically, all of the tests conducted on the previous LSI, or some necessary tests selected based on experience of a designer are conducted on the successive LSI. Moreover, a program structure of the successive LSI is analyzed and tests relating to improved parts may be selected to be conducted on the previous LSI.

However, because the LSI is formed in large scale and to have high performance as described above, the number of tests conducted on the previous LSI is enormous. Therefore, verification operation takes long time, and this leads to long design period. In addition, if the verification operation is performed based on experience of a designer, unnecessary tests can be selected to be included in the tests conducted on the successive LSI. Thus, the time necessary for verification operation increases, and as a result, the design period becomes longer. If the verification operation is performed analyzing the program structure of the successive LSI, only required tests can be selected. However, analysis of the program structure takes time. This also results in long design period.

SUMMARY OF THE INVENTION

It is an object of the present invention to at least solve the problems in the above conventional technologies.

A verification support device according to one aspect of the present invention supports logic verification of a design object using diagrams to which modification has been made, the diagrams in which processes of a first design object are expressed in a chronological order. The verification support device includes a receiving unit configured to receive the diagrams to which the modification has been made for a second design object; a detecting unit configured to detect, from among the processes, a modified process being a process corresponding to the modification to the diagrams, based on the diagrams before the modification is made and the diagrams after the modification is made; an applicability determining unit configured to determine whether test benches used for logic verification of the first design object are applicable to the logic verification of the second design object, based on the modified process; and an output unit configured to output the test benches based on a result of determination by the applicability determining unit.

A verification support method according to another aspect of the present invention is of supporting logic verification of a design object using diagrams to which modification has been made, the diagrams in which processes of a first design object are expressed in a chronological order. The verification support method includes inputting the diagrams to which the modification has been made for a second design object; detecting, from among the processes, a modified process being a process corresponding to the modification to the diagrams, based on the diagrams before the modification is made and the diagrams after the modification is made; determining whether test benches used for logic verification of the first design object are applicable to the logic verification of the second design object, based on the modified process; and outputting the test benches based on a result of determination at the determining.

A computer-readable recording medium that stores therein a computer program for realizing the verification support method according to the above aspect.

The other objects, features, and advantages of the present invention are specifically set forth in or will become apparent from the following detailed description of the invention when read in conjunction with the accompanying drawings.

DETAILED DESCRIPTION OF THE PREFERRED EMBODIMENTS

Exemplary embodiments of the present invention will be explained in detail below with reference to the accompanying drawings.

Figure 1:
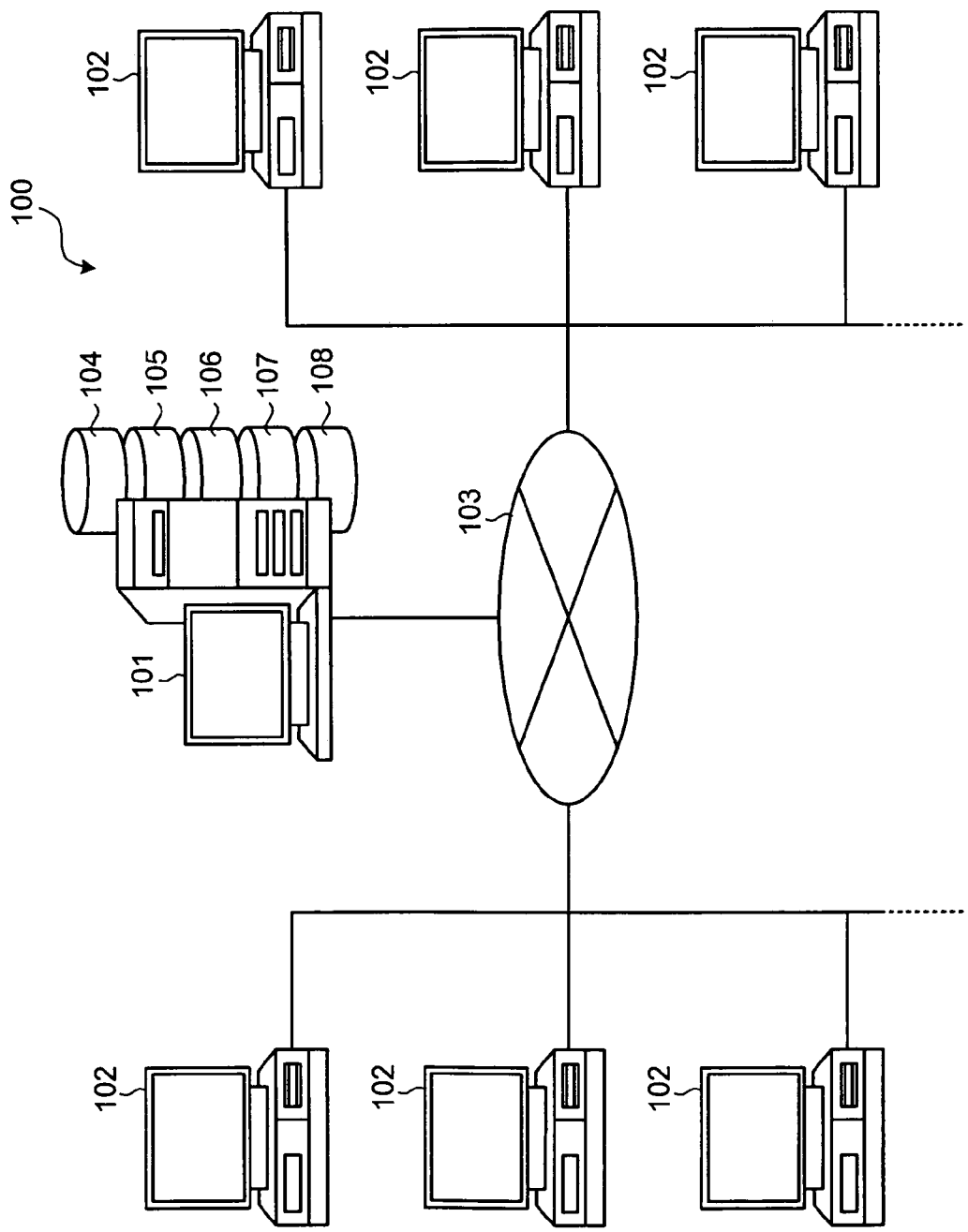
FIG. 1 is a schematic of a verification support system according to an embodiment of the present invention.

FIG. 1 is a schematic of a verification support system 100 according to an embodiment of the present invention. In the verification support system 100, a verification support device 101 and a plurality of terminal devices 102 are connected so as to be capable of communicating with each other via a network 103 such as a local area network (LAN), a wide area network (WAN), and the Internet.

The verification support device 101 modifies diagrams (sequence diagram, for example) in which processes of a design object is expressed in a chronological order, to support logic verification of the design object in the diagram after modification. Specifically, the verification support device 101 outputs test benches used for the design object shown in the diagrams after modification. The verification support device 101 also includes a sequence diagram database 104, a test bench database 105, a sequence diagram-test bench correspondence table 106, a source code database 107, and a regression-test log database 108. These databases and a table will be described later. The terminal devices 102, with input operations by users, receive test benches output from the verification support device 101 via the network 103.

Figure 2:
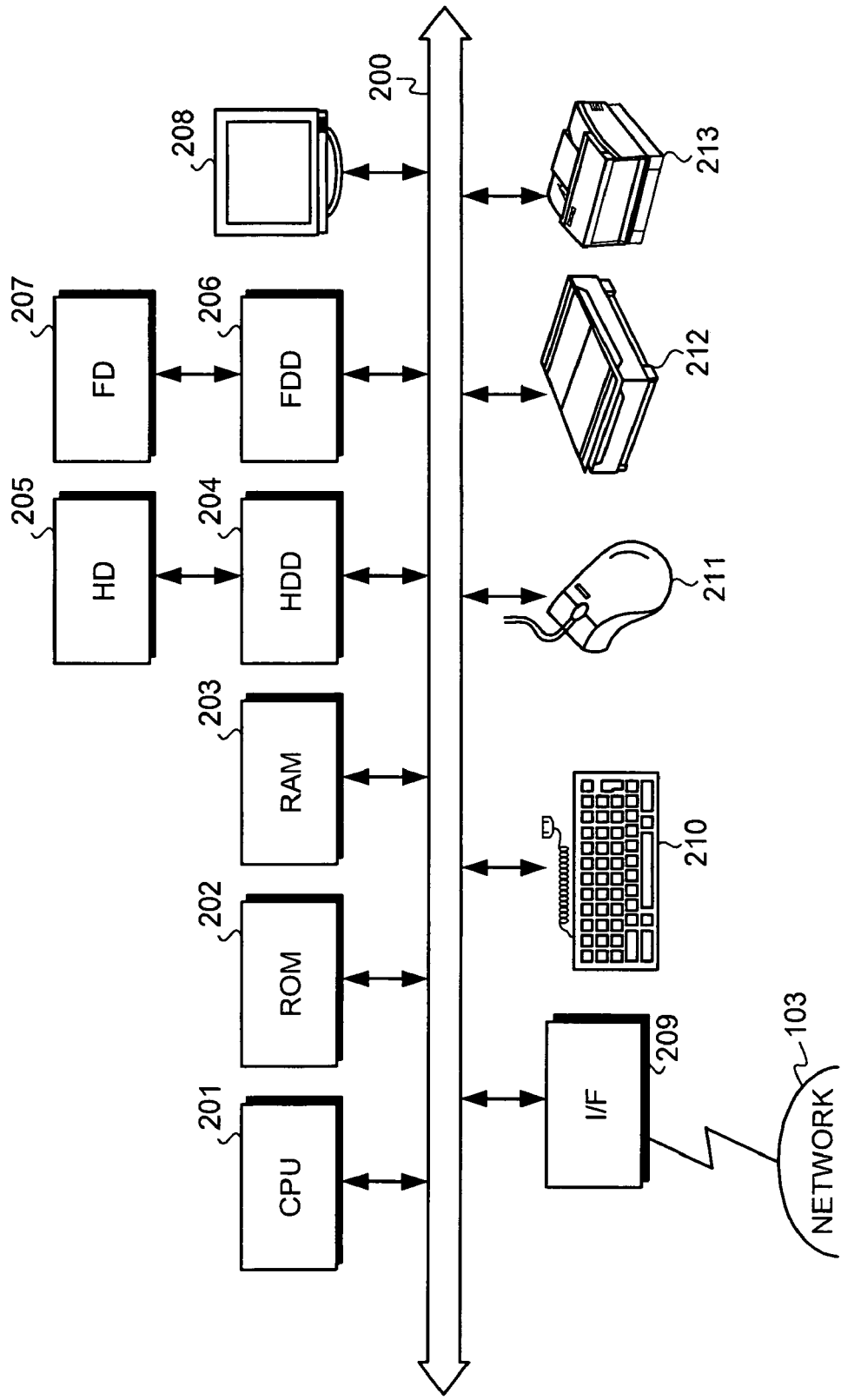
FIG. 2 is a schematic of a verification support device and a terminal device according to the embodiment.

FIG. 2 is a schematic of the verification support device and the terminal devices according to the embodiment. As shown in FIG. 2, the verification support device 101 and terminal devices 102 each includes, a central processing unit (CPU) 201, a read-only memory (ROM) 202, a random-access memory (RAM) 203, a hard disk drive (HDD) 204, a hard disk (HD) 205, a flexible disk drive (FDD) 206, a flexible disk (FD) 207 as an example of a removable recording medium, a display 208, an interface (I/F) 209, a keyboard 210, a mouse 211, a scanner 212, and a printer 213. Each component is connected to each other through a bus 200.

The CPU 201 controls the entire verification support device 101 and terminal devices 102. The ROM 202 stores programs such as a boot program. The RAM 203 is used as a work area of the CPU 201. The HDD 204 controls the reading/writing of data to and from the HD 205 in compliance with the control by the CPU 201. The HD 205 stores data written under the control of the HDD 204.

The FDD 206 controls the reading/writing of data to/from the FD 207 in compliance with the control by the CPU 201. The FD 207 stores data written under the control of the FDD 206, and makes the verification support device 101 and terminal devices 102 read the data stored in the FD 207.

Besides the FD 207, a compact-disc read-only memory (CD-ROM), a compact-disc recordable (CD-R), a compact-disc rewritable (CD-RW), a magneto optical (MO) disk, a digital versatile disk (DVD), a memory card, etc., can be used as a removable recording medium. The display 208 displays a cursor, icons, tool boxes, and data such as documents, images, and function information. For example, a cathode ray tube, a thin-film-transistor liquid crystal display, a plasma display etc., can be employed as the display 208.

The I/F 209 is connected to the network 103 such as the Internet via a communication line, and connected to other devices through the network 103. The I/F 209 controls the network 103 and internal interfaces, and controls input and output of data from external devices. As the I/F 209, a modem, a LAN adaptor, etc., can be employed, for example.

The keyboard 210 includes keys for inputting characters, numbers, various instructions, etc., and conducts data input. The keyboard 210 can be a touch-panel input pad or a numeric keypad. The mouse 211 conducts such operations as moving the cursor and selecting a range, or moving the window and changing the size of the window. A trackball or a joystick can be employed as long as similar functions are provided as a pointing device.

The scanner 212 reads optically images, and captures image data into the verification support device 101 and terminal devices 102. The scanner 212 may have an optical character recognition (OCR) function. The printer 213 prints image data and document data. As the printer 213, a laser printer or an ink-jet printer can be employed, for example.

Figure 3:
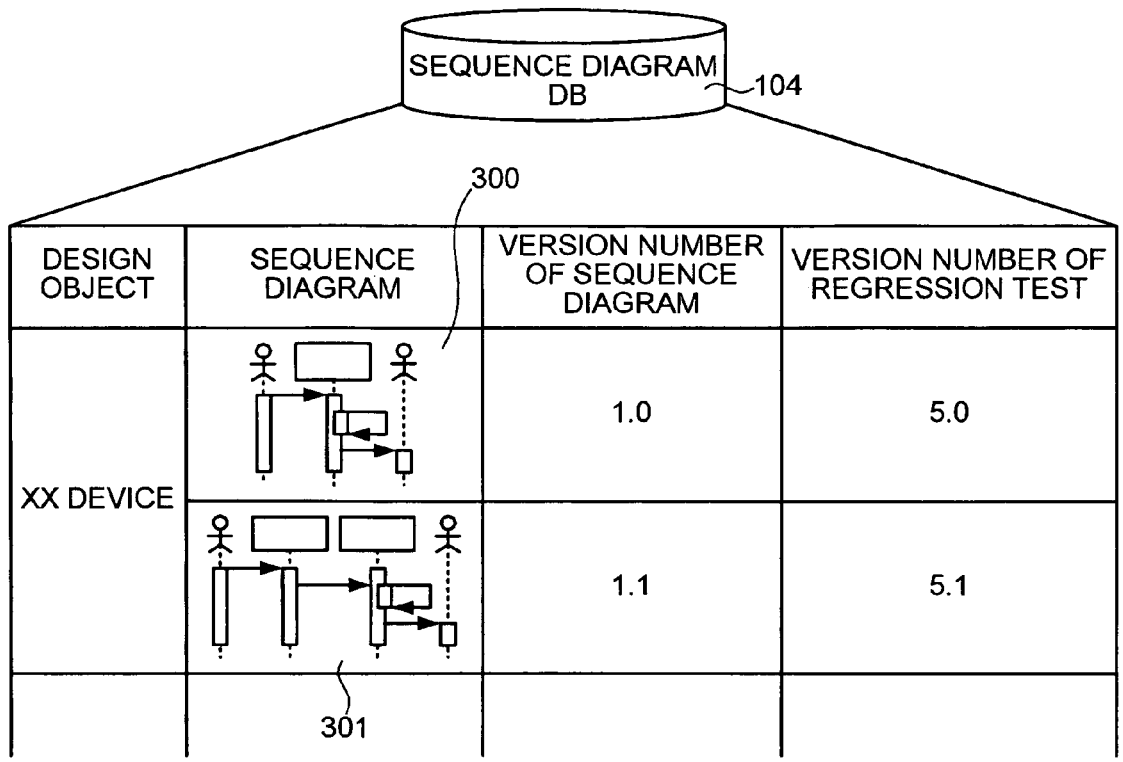
FIG. 3 is a schematic for illustrating contents stored in a sequence diagram database.

FIG. 3 is a schematic for illustrating contents stored in the sequence diagram database 104. In the sequence diagram database 104, sequence diagrams, version numbers of the sequence diagrams, and version numbers of the regression tests are stored for each design object. The sequence diagrams are generated with a computer-readable description language such as the unified modeling language (UML), and are examples of diagrams in which processes of a design object are expressed in a chronological order. Although a sequence diagram is cited as an example here, a use case diagram can be used to show the flow of data in a chronological order.

The version numbers of the sequence diagrams are the numbers given when the sequence diagrams are stored in the sequence diagram database. The version numbers of the regression tests are the numbers given when the design object of the sequence diagrams pass logic verifications (regression tests). When the logic verifications are not conducted, or when the design objects fail to pass the logic verifications, version numbers of the logic verifications are not given.

Two sequence diagrams 300, 301 are stored for a design object "XX device". The sequence diagram 300 of version number 1.0 passed a regression test of version number 5.0. The sequence diagram 301 of version number 1.1 is a modified sequence diagram of the sequence diagram of version number 1.0, and passed a regression test of version number 5.1.

Figure 4:
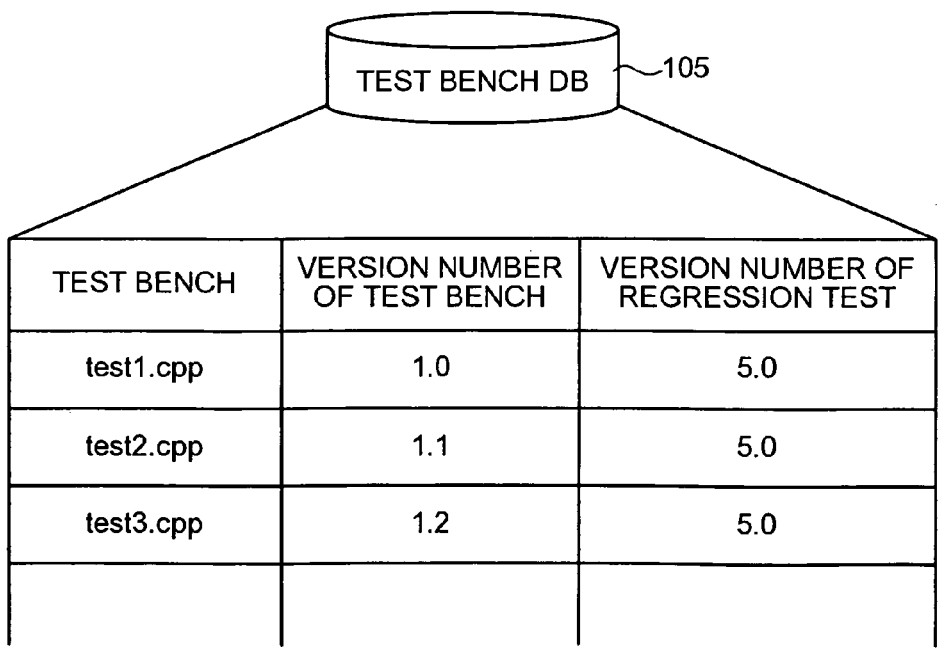
FIG. 4 is a schematic for illustrating contents stored in a test bench database.

The storage contents of the test bench database 105 will be described next. FIG. 4 is a schematic for illustrating contents stored in the test bench database 105. As shown in FIG. 4, test benches test1.cpp to test3.cpp, version numbers of the test benches test1.cpp to test3.cpp, and version numbers of the regression tests are stored in the test bench database 105. Test benches test1.cpp to test3.cpp are descriptions to verify operations of the design object. The operations include clock generation, input pattern generation, and comparison with expected values. The test benches test1.cpp to test3.cpp are given by actors of the sequence diagrams 300 and 301 of FIG. 3. The version numbers of the test benches test1.cpp to test3.cpp are the numbers given when the test benches test1.cpp to test3.cpp are stored in the test bench database 105. The version numbers of the regression tests are the numbers given when given design object pass the logic verifications. When logic verifications are not conducted or the design objects fail the logic verifications, the version numbers of the regression tests are not given.

Figure 5:
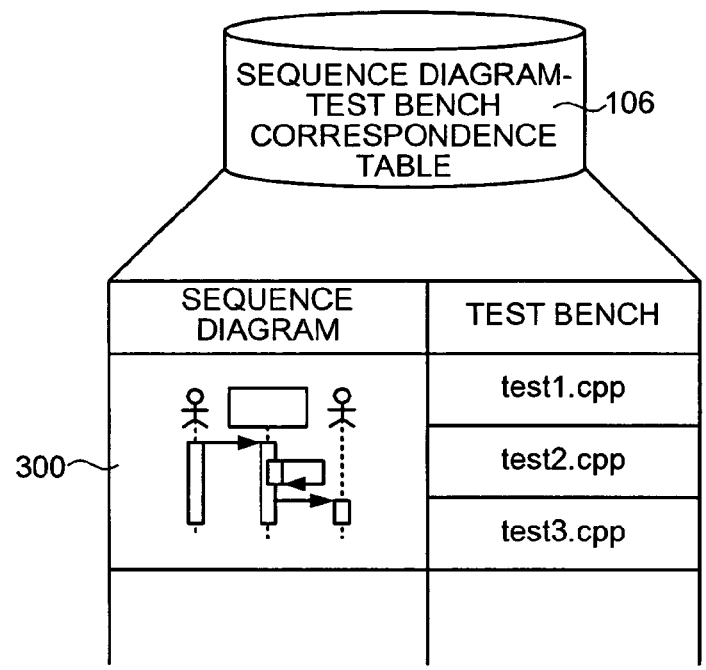
FIG. 5 is a schematic for illustrating a correspondence table of a sequence diagram to test benches.

The sequence diagram-test bench correspondence table 106 will be described here. FIG. 5 is a schematic of the sequence diagram-test bench correspondence table 106. In the sequence diagram-test bench correspondence table 106, the sequence diagrams of the design object correspond to the test benches conducted on the design objects in the sequence diagrams. In the example of FIG. 5, the sequence diagram 300 of the design object, on which the regression tests of the version numbers of FIG. 3 have been conducted, corresponds to the test benches test1.cpp to test3.cpp that are used for the regression tests of version number 5.0 of FIG. 4.

Figure 6:
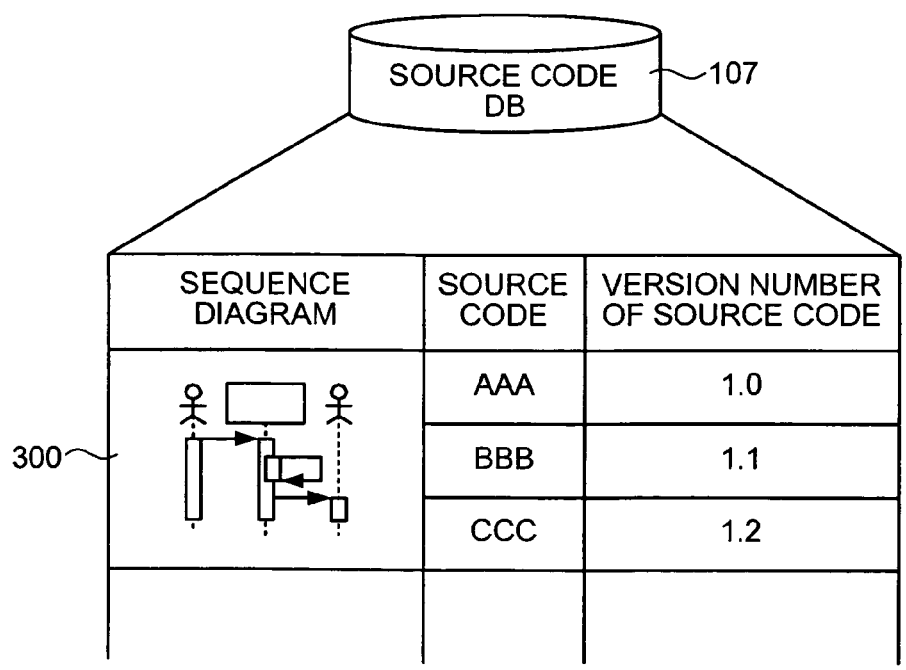
FIG. 6 is a schematic for illustrating contents stored in a source code database.

FIG. 6 is a schematic for illustrating contents stored in the source code database 107. In the source code database 107, source codes and version numbers of the source codes are stored for each sequence diagram. The source codes are design data of design contents of the design object indicated by the sequence diagrams. The version numbers of the source codes are the numbers given when the source codes are stored in the source code database 107.

In the example of FIG. 6, source codes AAA, BBB, and CCC for the sequence diagram 300 of FIG. 3 are stored. The source code AAA of the version number 1.0 is data that is designed based on the sequence diagram 300. The source code BBB of the version number 1.1 is the data given by modifying the source code AAA. The source code CCC of the version number 1.2 is the data given by modifying the source code BBB.

Figure 7:
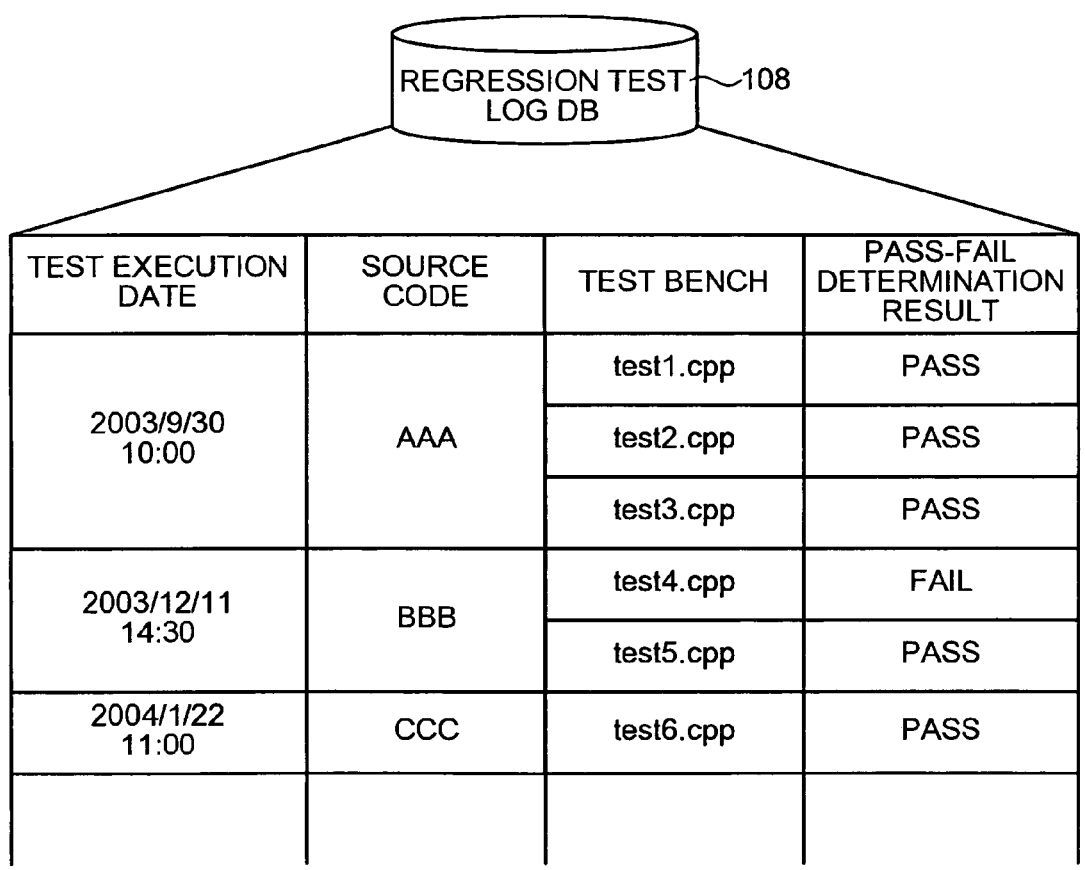
FIG. 7 is a schematic for illustrating contents stored in a regression-test log database.

FIG. 7 is a schematic for illustrating contents stored in the regression-test log database 108. In the regression-test log database 108, test execution dates of the regression tests, regression-test executed source codes, test benches used for the regression tests, and pass-fail determination results of logic verifications by regression tests are stored. For example, the test benches test1.cpp to test3.cpp are used on the source code AAA of FIG. 6, and the code passed all the tests.

Figure 8:
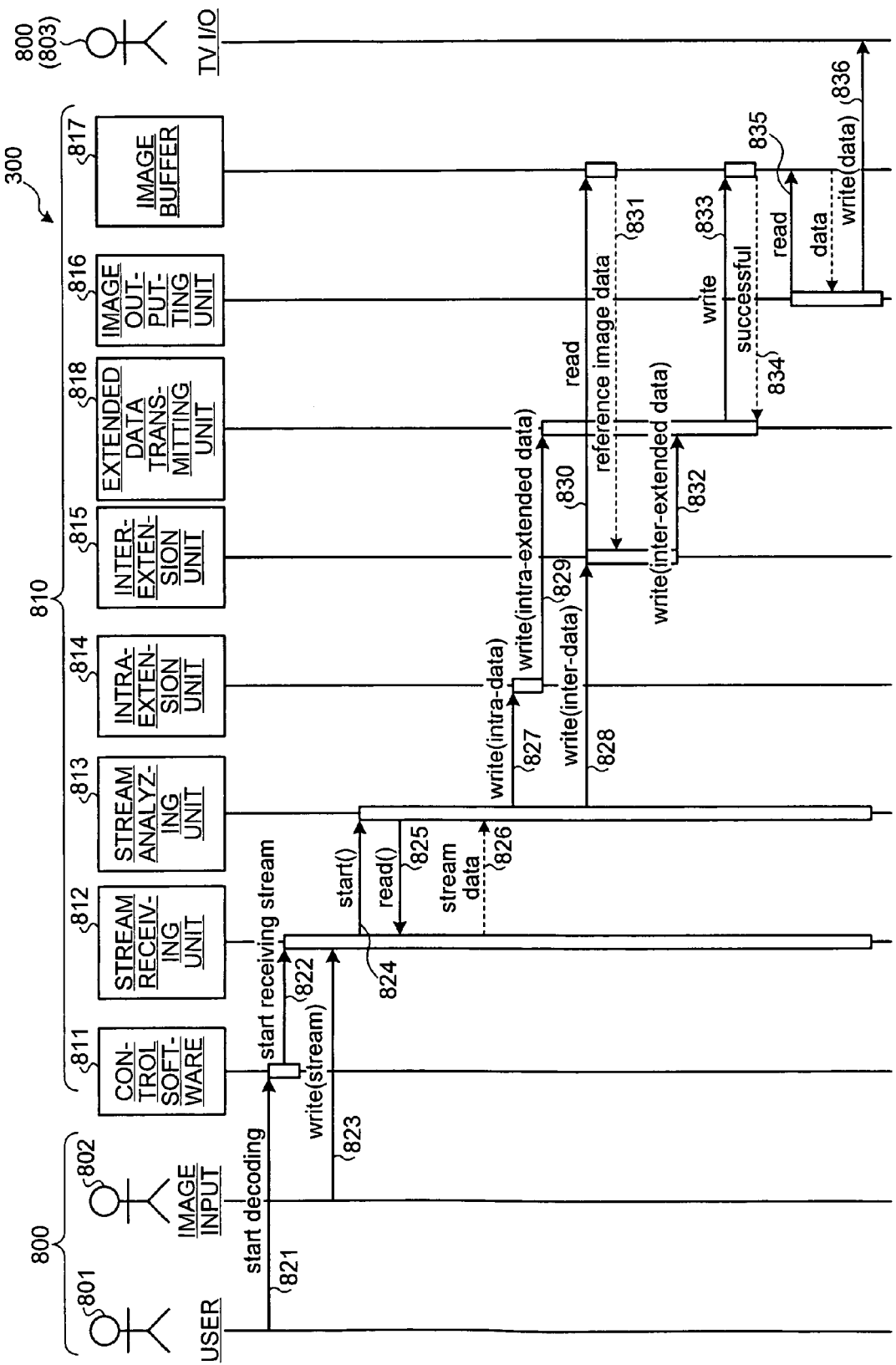
FIG. 8 is a schematic for illustrating a sequence diagram stored in the sequence diagram database shown in FIG. 3.
Figure 9:
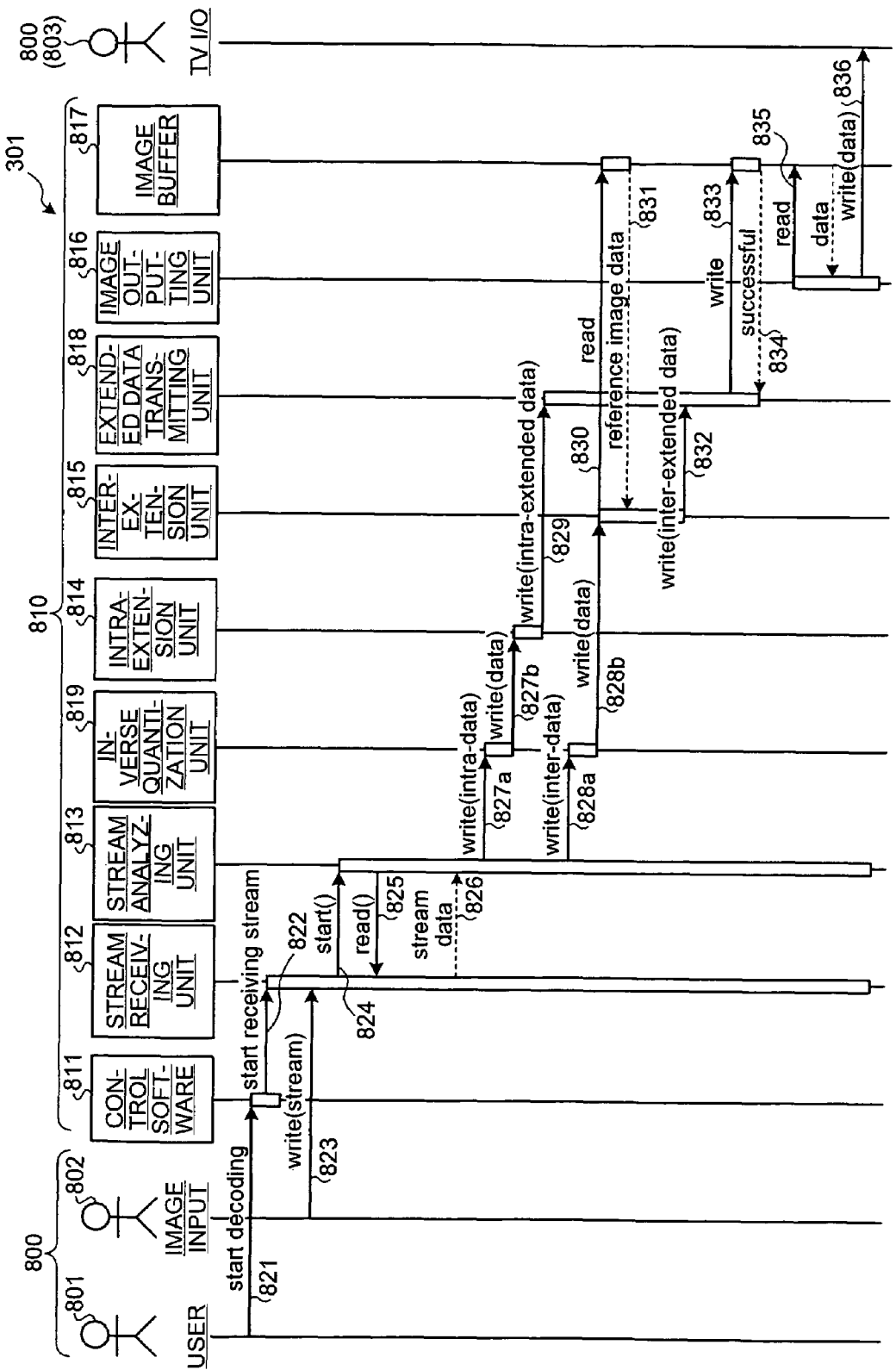
FIG. 9 is a schematic for illustrating a sequence diagram stored in the sequence diagram database shown in FIG. 3.

FIGS. 8 and 9 are the sequence diagrams 300 and 301 stored in the sequence diagram database 104 of FIG. 3. In the sequence diagram 300, actors 800 and objects 810 are written. The actors 800 are abstract external entities that input data externally at the sequence diagram 300. In FIG. 8, a user 801, an image inputting device 802, and a television interface (TV I/O) 803 are written as actors 800.

The objects 810 show an internal configuration (including hardware and software) of a design object. As the objects 810 of FIG. 8, eight instantiated classes 811 to 818 are written (a control software 811, a stream receiving unit 812, a stream analyzing unit 813, an intra-extension unit 814, an inter-extension unit 815, an image output unit 816, an image buffer 817, and an extended data transmitting unit 818). Each vertical axis of the actors 800 and classes is called a life line of the actors 800 and classes, and activation (rectangles on the life lines) indicating survival periods are written on life lines of some of the classes. Processes (methods) 821 to 836 of the actors 800 and objects 810 (classes 811 to 818) are indicated on intervals among the objects 810 and between the actors 800 and the objects 810. The processes 821 to 836 are called "operation" having dynamic characteristics of the objects 810, and are written as member functions.

The flow of the processes of the sequence diagram 300 of FIG. 8 will be explained here. A design object here indicates a DVD player. When a user 801 inputs the process 821 of "start decoding", the control software 811 conducts a process 822 of "start receiving stream". When an image data writing process ("write(stream)") 823 receives the stream from the image inputting device 802, the stream receiving unit 812 conducts a process ("starto") 824 that transmits a transmission starting signal of the received image data (stream data) to the stream analyzing unit 813. The stream analyzing unit 813 conducts a reading process ("reado") 825 of the image data for analysis, against the stream receiving unit 812. When a certain amount of image data is stored, a transmitting process ("stream data") 826 of received image data is conducted against the stream analyzing unit 813.

The stream analyzing unit 813 analyzes received image data, and extracts intra-data and inter-data. The stream analyzing unit 813 conducts a transmitting process ("write(intra-data)") 827 that transmits the extracted intra-data to the intra-extension unit 814, and conducts a transmitting process ("write(inter-data)") 828 that transmits the extracted inter-data to the inter-extension unit 815. The intra-data extension unit 814 conducts a transmitting process ("write(intra-extended data)") 829 that transmits the intra-extended data to the extended data transmitting unit 818. The transmitting process 829 is repeated until images equivalent to one piece of image are processed. The inter-extension unit 815 conducts a reading process ("read") 830 of reference image data to the image buffer 817, and the image buffer 817 conducts a transmitting process ("reference image data") 831 that transmits the reference image data to the inter-extension unit 815. The inter-extension unit 815 conducts a transmitting process ("write(inter-extended data)") 832 that transmits the inter-extended data to the extended data transmitting unit 818.

The extended data transmitting unit 818 conducts a transmitting process ("write") 833 that transmits image data to the image buffer 817. The transmitting process 833 is conducted until images equivalent to one piece of image are processed. When the images equivalent to one piece of image are processed, the image buffer 817 conducts a transmitting process ("successful") 834 that informs the extended data transmitting unit 818 that the images equivalent to one piece of image have been processed. When filtering of images equivalent to three pieces of images is conducted, the image output unit 816 conducts a reading process ("read") 835 of the images. The image output unit 816 conducts a transmitting process ("write (data)") 836 that transmits images that are read at the reading process 835 to the television interface 803.

The sequence diagram 301 of FIG. 9 will be described next. The sequence diagram 301 of FIG. 9 is an modified diagram of the sequence diagram 300 of FIG. 8. Specifically, an inverse quantization unit 819 is added between the stream analyzing unit 813 and the intra-extension unit 814 of the sequence diagram 301, and the rest of the parts are the same as the sequence diagram 300. Therefore, the same reference numerals will be used and descriptions will be abbreviated. With the addition of the inverse quantization unit 819, the stream analyzing unit 813 conducts a transmitting process ("write(intra-data)") 827a that transmits the extracted intra-data to the inverse quantization unit 819, and conducts a transmitting process ("write(inter-data)") 828a that transmits the extracted inter-data to the inverse quantization unit 819. The inverse quantization unit 819 inverse-quantizes the received intra-data, and conducts a transmitting process ("write(data)") 827b that transmits the intra-data to the intra-extension unit 814. The transmitting process 827b is repeated until images equivalent to one piece of image are processed. The inverse quantization unit 819 inverse-quantizes the received inter-data, and conducts a transmitting process ("write(data)") 828b that transmits the inter-data to the inter-extension unit 815.

Figure 10:
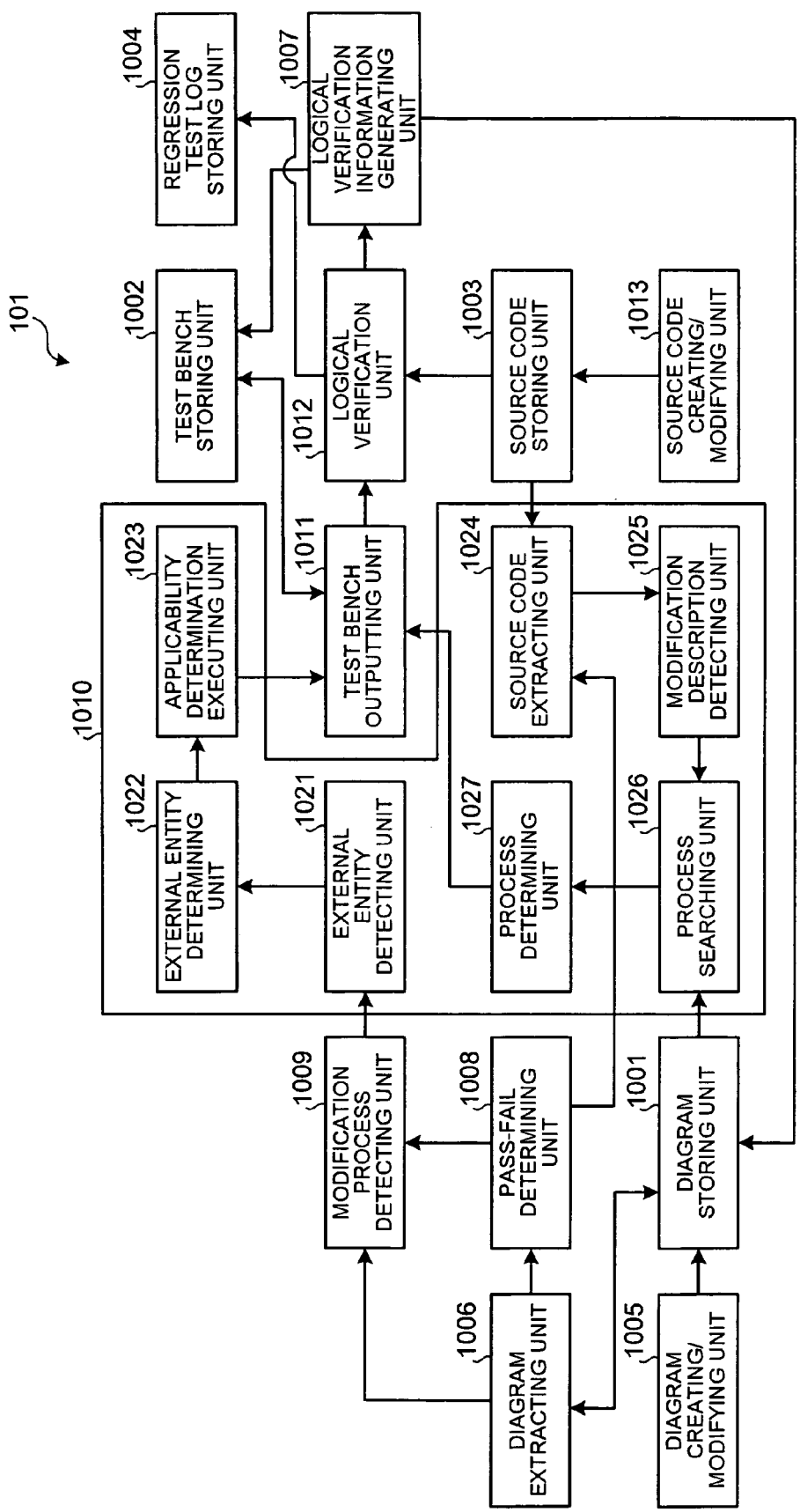
FIG. 10 is a block diagram of the verification support device.

FIG. 10 is a block diagram of the verification support device. The verification support device 101 includes, a diagram storing unit 1001, a test bench storing unit 1002, a source code storing unit 1003, a regression test log storing unit 1004, a diagram creating/modifying unit 1005, a diagram extracting unit 1006, a logic verification information generating unit 1007, a pass-fail determining unit 1008, a modified process detecting unit 1009, an applicability determining unit 1010, a test bench output unit 1011, a logic verification unit 1012, and a source code creating/modifying unit 1013.

The diagram storing unit 1001 stores diagrams in which processes of the design object are expressed in a chronological order and information on the diagrams. Specifically, the diagram storing unit 1001 stores the sequence diagrams 300 and 301 of FIGS. 8 and 9, and more specifically, includes the sequence diagram database 104 of FIG. 3. The test bench storing unit 1002 stores the test benches used for the logic verifications of the design object. Specifically, the test bench storing unit 1002 includes the test bench database 105 of FIG. 4.

The source code storing unit 1003 stores source codes of the design contents of the design object. Specifically, the source code storing unit 1003 includes the source code database 107 of FIG. 6. The regression test log storing unit 1004 stores logs of the regression tests. The regression test log storing unit 1004 includes the regression-test log database 108 of FIG. 7. The functions of the diagram storing unit 1001, the test bench storing unit 1002, the source code storing unit 1003, and the regression test log storing unit 1004 can be realized by the ROM 202, the RAM 203, the HD 205, the FD 207, etc.

The diagram creating/modifying unit 1005 creates and modifies diagrams of the processes of the design object in chronological order. For example, with designer's operation, the diagram creating/modifying unit 1005 creates the sequence diagram 300 of FIG. 8, modifies the created sequence diagram 300, and generates the sequence diagram 301 of FIG. 9. The created and modified sequence diagrams 300 and 301 are stored in the diagram storing unit 1001.

The diagram extracting unit 1006 extracts diagrams stored in the diagram storing unit 1001. Specifically, with designer's operation, the diagram extracting unit 1006 extracts an arbitrary sequence diagram from the sequence diagram 300 of FIG. 3, such as an modified sequence diagram 301 that is modified by the diagram creating/modifying unit 1005.

The logic verification information generating unit 1007 generates information relating to logic verifications conducted on the design object. Specifically, when the design objects pass the logic verifications (regression tests), the logic verification information generating unit 1007 generates the version numbers of the regression tests, and provide the numbers to the sequence diagrams of the processes of the design object that have passed the regression tests, to the test benches used for the passed regression tests, and to the source codes indicating design contents of the design object that have passed the regression tests.

Based on the information relating to the logic verifications generated by the logic verification information generating unit 1007, the pass-fail determining unit 1008 determines whether the design object of the modified diagrams extracted by the diagram extracting unit 1006 passed the logic verifications. Specifically, the pass-fail determining unit 1008 determines whether the version numbers of the regression tests are provided to the modified sequence diagram 301 that is extracted by the diagram extracting unit 1006.

The modified process detecting unit 1009 compares the diagrams before modification and the diagrams after modification, that are modified by the diagram extracting unit 1006, and detects modified processes (hereinafter, "modified process"). Specifically, on the same design object, the modified process detecting unit 1009 compares the sequence diagram 300 (refer to FIG. 8) with version number 1.0 before modification that is shown in FIG. 3 and the sequence diagram 301 (refer to FIG. 9) with version number 1.1 after modification that is shown in FIG. 3. Then, from the sequence diagram 301 with modified version 1.1, the modified process detecting unit 1009 detects the processes 827*a* and 828*a* that are input at the active intervals of the inverse quantization unit 819 as modified processes. The modified process detecting unit 1009 might be set to compare the diagrams before and after modification and detect modified processes, when the pass-fail determining unit 1008 determines that the design objects failed the verification tests.

Based on the modified processes 827*a* and 828*a* detected by the modified process detecting unit 1009, the applicability determining unit 1010 determines whether the test benches used for the logic verifications of the design object shown in the diagrams before modification can be applied to the logic verifications of the design object shown in the diagrams after modification. Specific contents of the applicability determining unit 1010 will be described later.

The test bench output unit 1011 outputs the test benches based on the determination results determined by the applicability determining unit 1010. Specifically, the test bench output unit 1011 extracts the test benches that can be applied from the test bench storing unit 1002 based on the determination results determined by applicability determining unit 1010, and outputs the test benches to the logic verification unit 1012. The logic verification unit 1012 conducts the regression tests of the source codes, using the test benches output from the test bench output unit 1011.

The source code creating/modifying unit 1013 creates and modifies the source codes that indicate the design contents of the design object. For example, with the designer's operation, the source code creating/modifying unit 1013 creates the source code AAA of FIG. 6, modifies the created source code AAA to make the source code BBB, and modifies the modified source code BBB to make the source code CCC. The created and modified source codes are stored in the source code storing unit 1003.

As shown in FIG. 10, the applicability determining unit 1010 includes an external entity detecting unit 1021, an external entity determining unit 1022, and an applicability determination executing unit 1023. From an external entity group that inputs data externally at modified diagrams of the design object, the external entity detecting unit 1021 detects external entities that execute the modified processes detected by the modified process detecting unit 1009 by inputting the data. Specifically, from a plurality of actors 800 (refer to FIG. 8) as external entities that are written on the modified sequence diagram 301 of FIG. 9, the external entity detecting unit 1021 detects the actors 800 that execute modified processes 827*a* and 828*a*. More specifically, the external entity detecting unit 1021 detects the stream analyzing unit 813 that is a class executing the transmitting process ("write (intra-data)") 827*a* of the image data that is a modified process, detects the stream receiving unit 812 that is a class executing the transmitting process ("stream data") 826 that transmits the stream data (image data) for the detected stream analyzing unit 813 to analyze, and detects the image inputting device 802 that is the actor 800 executing the transmitting process ("write (stream)") 823 of the stream data (image data) to the detected stream receiving unit 812.

The external entity determining unit 1022 determines whether the diagrams before modification include the external entities detected by the external entity detecting unit 1021. Specifically, the external entity determining unit 1022 determines whether the image inputting device 802 detected by the external entity detecting unit 1021 is written on the sequence diagram 301 before modification. When it is not written, the external entity determining unit 1022 determines that the diagrams before modification do not include the external entities detected by the external entity detecting unit 1021. When it is written, the external entity determining unit 1022 determines whether the process 823 conducted by the image inputting device 802 (detected actors 800) that is written in the sequence diagram 301 after modification and the process 823 conducted by the image inputting device 802 that is written in the sequence diagram 300 before modification correspond. When they do not correspond, the external entity determining unit 1022 determines that the diagram 300 before modification does not include the actors 800 detected by the external entity detecting unit 1021. When they correspond, the external entity determining unit 1022 determines that the diagram 300 before modification includes the actors 800 detected by the external entity detecting unit 1021.

The applicability determination executing unit 1023, based on the determination results determined by the external entity determining unit 1022, determines whether the test benches used for the logic verifications of the design object of the diagrams before the modification can be applied to the logic verifications of the design object of the diagrams after the modification. Specifically, when the external entity determining unit 1022 determines that the sequence diagram 300 includes the actors 800 detected by the external entity detecting unit 1021, the applicability determination executing unit 1023 determines that the test benches used for the design object of the sequence diagram 300 before modification can be applied. More specifically, the test benches used for the logic verifications of the source codes of the sequence diagram 300 in FIG. 8 can be applied to the source codes of the sequence diagram 301 in FIG. 9.

The applicability determining unit 1010 includes a source code extracting unit 1024, a modification description detecting unit 1025, a process searching unit 1026, and a process determining unit 1027. When the design objects pass the logic verifications of the pass-fail determining unit 1008, the source code extracting unit 1024 extracts, from the source code group indicating the design contents of the design object that passed the logic verifications, the source codes used for the passed logic verifications and the modified source codes of the source codes used for the logic verifications. The modified source codes of the source codes used for the logic verifications can be specified by comparing the version numbers of the source codes. For example, in FIG. 6, when a source code used for the passed logic verifications is source code BBB, the source code extracting unit 1024 extracts the source code CCC that includes the latest version number instead of the source code BBB.

The modification description detecting unit 1025 detects modified descriptions (hereinafter, "modification description") by comparing the source codes extracted by the source code extracting unit 1024. Specifically, the modification description detecting unit 1025 detects the modification descriptions using diff command.

The process searching unit 1026 detects, from the diagrams other than diagrams of the design object that passed the logic verifications, the processes that are indicated by the modification descriptions detected by the modification description detecting unit 1025. Specifically, the process searching unit 1026 searches the diagram storing unit 1001, and extracts the processes indicated by the detected modification descriptions (member functions) from the sequence diagrams other than diagrams of the design object that passed the logic verifications.

The process determining unit 1027 determines whether the diagrams of the design object that passed the logic verifications include the processes detected by the process searching unit 1026. Specifically, when the sequence diagrams of the design object that passed logic verifications include the processes detected by the process searching unit 1026, the test bench output unit 1011 extracts the test benches that correspond to the sequence diagrams that include the processes detected by the process searching unit 1026 from the test bench storing unit 1002, referring to the sequence diagram-test bench correspondence table 106 of FIG. 5.

The functions of the diagram creating/modifying unit 1005, the diagram extracting unit 1006, the logic verification information generating unit 1007, the pass-fail determining unit 1008, the modified process detecting unit 1009, the applicability determining unit 1010, the test bench output unit 1011, the logic verification unit 1012, and the source code creating/modifying unit 1013 are realized with the CPU 201 executing the programs recorded in the ROM 202, RAM 203, HD 205, FD 207, etc., or with the I/F 209, for example.

Figure 11:
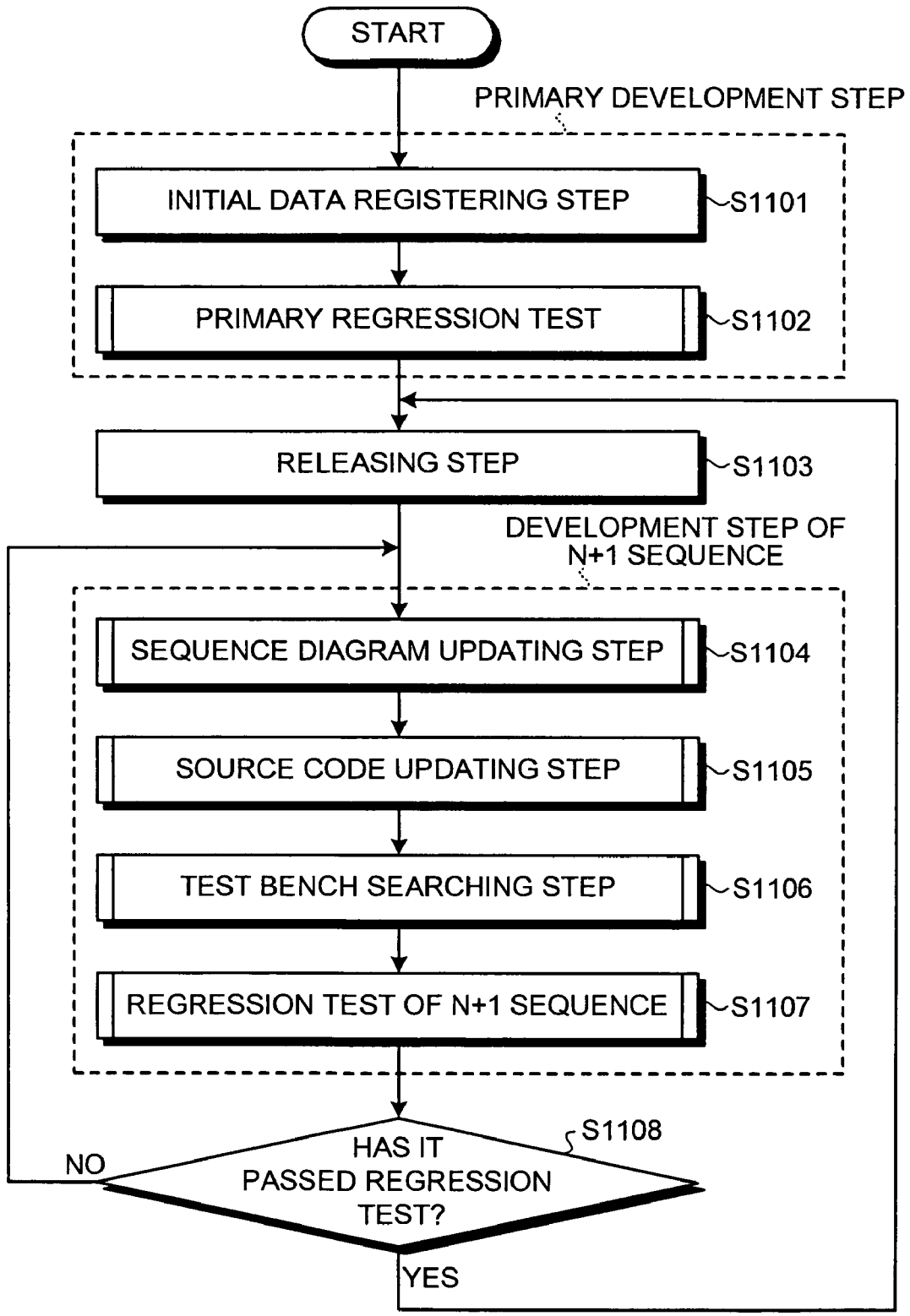
FIG. 11 is a flowchart of a verification support process according to the embodiment.

FIG. 11 is a flowchart of the verification support process according to the embodiment. As shown in FIG. 11, an initial data registering step (step S1101) is conducted first. At this step, the sequence diagram 300 with the version number 1.0 that is the design data of the primary development of the design object, the test benches test1.cpp to test3.cpp, and the source code AAA of the version 1.0 are registered at each database 104, 105, and 107. Next, the primary regression test (step S1102) is conducted by the registered data that are registered at the initial data registering step. The initial data registering step (step S1101) and the primary regression test (step S1102) is called primary development step. Then a releasing step (step S1103) is conducted that confirms the source codes that passed the regression test.

An update (modification) of the sequence diagram is conducted by the sequence diagram updating step (step S1104), and an update (modification) of the source code is conducted by the source code updating step (step S1105). Then a test bench searching step is conducted (step S1106). Specifically, test bench searching step searches, from the test benches used for the sequence diagrams or source codes before modification, the test benches that can be applied to the sequence diagrams or source codes after modification. Then a regression test of n+1 sequence is conducted by applying the searched test benches (step S1107). From the sequence diagram updating step to the regression test step (steps S1104 to S1107) is called development step of n+1 sequence (n=1, 2, 3 . . . ). If the design object passes the regression test of n+1 sequence (step S1108: YES), it is moved to the releasing step (step S1103), and when it fails the test (step S1108: NO), it is moved to the next development step of n+1 sequence (step S1104).

Figure 12:
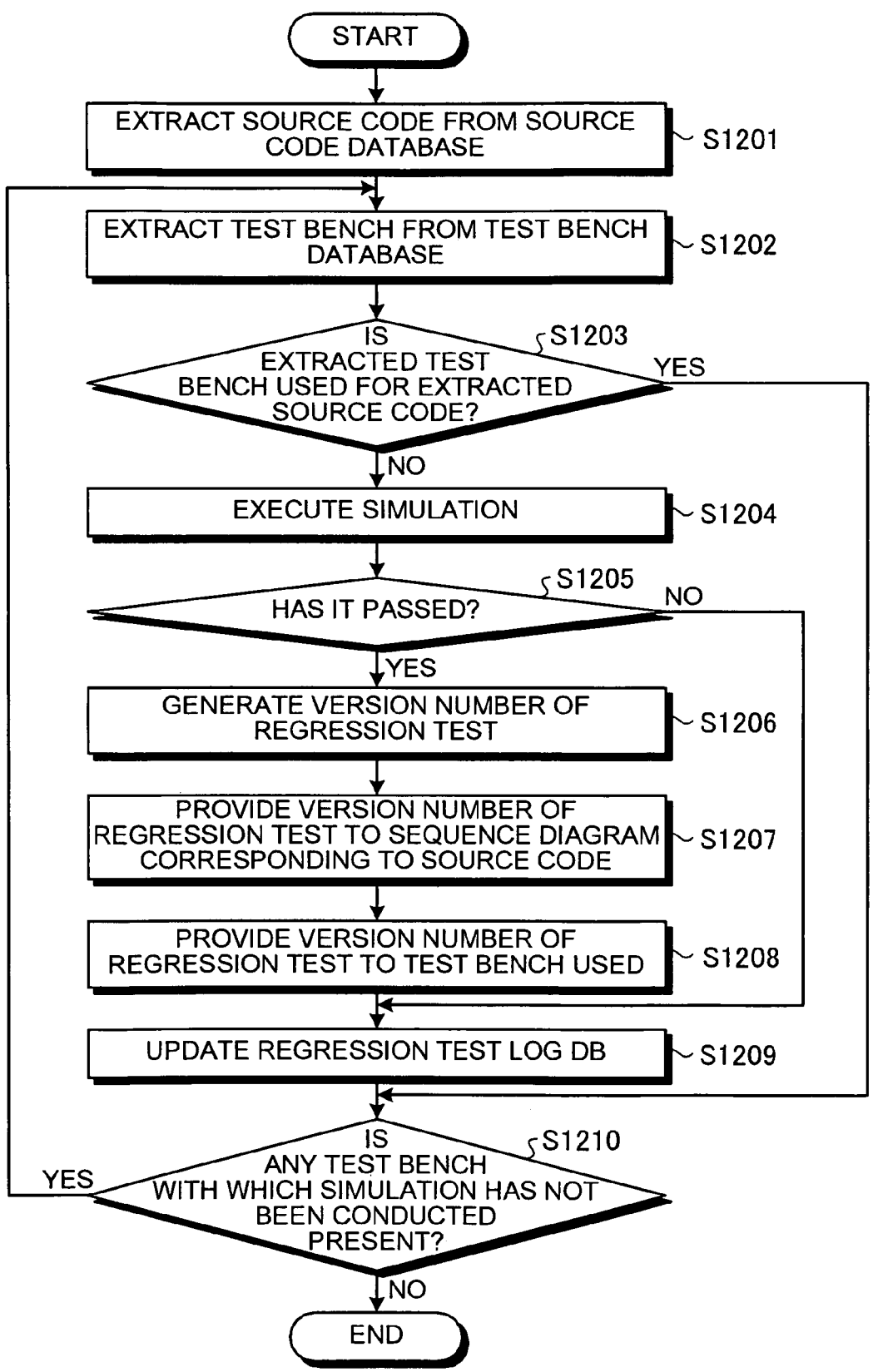
FIG. 12 is a flowchart of a primary regression test shown in FIG. 11.

The procedure of the primary regression test of FIG. 11 will be described here. FIG. 12 is a flowchart of the procedure of the primary regression test of FIG. 11. First, an arbitrary source code is extracted from the source code database 107 (step S1201). An arbitrary test bench is also extracted from the test bench database 105 (step S1202). Then, whether the extracted test bench is already used for the extracted source code is determined (step S1203). If it is already used (step S1203: YES), it moves to step S1210. If it is not used (step S1203: NO), a simulation is conducted to verify an operation of the design object that is designed with a source code, using the extracted test bench.

If the test bench fails the simulation (step S1205: NO), it is moved to a step S1209. If it passes the simulation (step S1205: YES), a version number of the regression test is generated (step S1206). Then, the version number of the regression test is provided to the sequence diagram corresponding to the source code (step S1207), and the regression-test log database 108 of the test bench used is updated (step S1209).

When there is a test bench that has not conducted a simulation (step S1210: YES), it is moved to the step S1202. When there is no test bench that has not conducted a simulation (step S1210: NO), the primary regression test is terminated.

Figure 13:
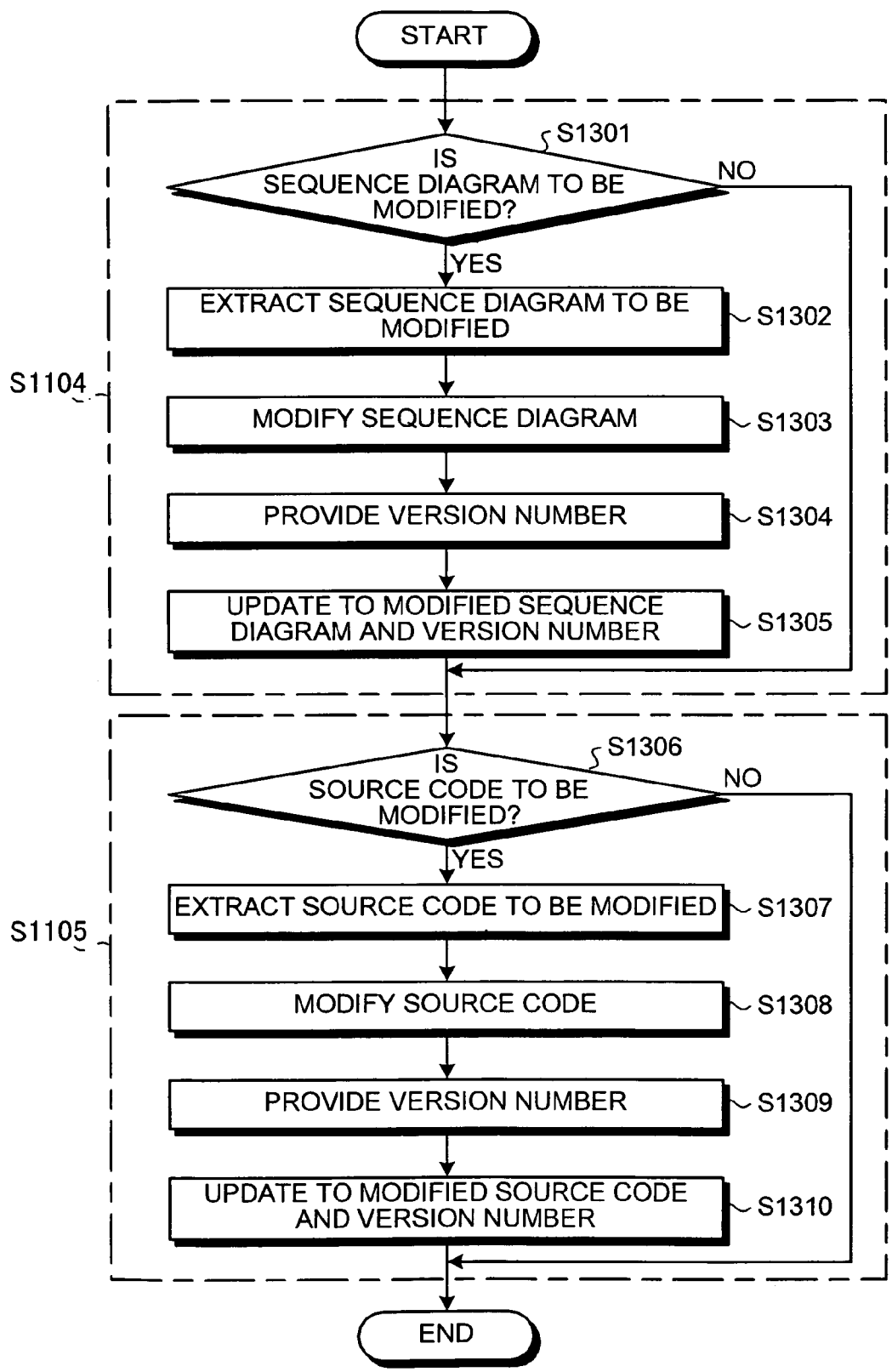
FIG. 13 is a flowchart of a sequence-diagram updating process and a source-code updating process shown in FIG. 11.

FIG. 13 is a flowchart of the sequence-diagram updating process and the source-code updating process of FIG. 11. As shown in FIG. 13, if the sequence diagram is not to be modified (step S1301: NO), it is moved to a step S1306. If the sequence diagram is to be modified (step S1301: YES), the sequence diagram to be modified is extracted (step S1302). And, the extracted sequence diagram is modified (step S1303). Then a version number is provided to the modified sequence diagram (step S1304) and updated to the modified sequence diagram and the version number (step S1305).

If the source code is not to be modified (step S1306: NO), a series of the procedure is terminated. If the source code is to be modified (step S1306: YES), the source code is extracted (step S1307), and the extracted source code is modified (step S1308). Then, the version number is provided to the modified source code (step S1309), and the source code is updated to the modified source code and the version number (step S1310).

Figure 14:
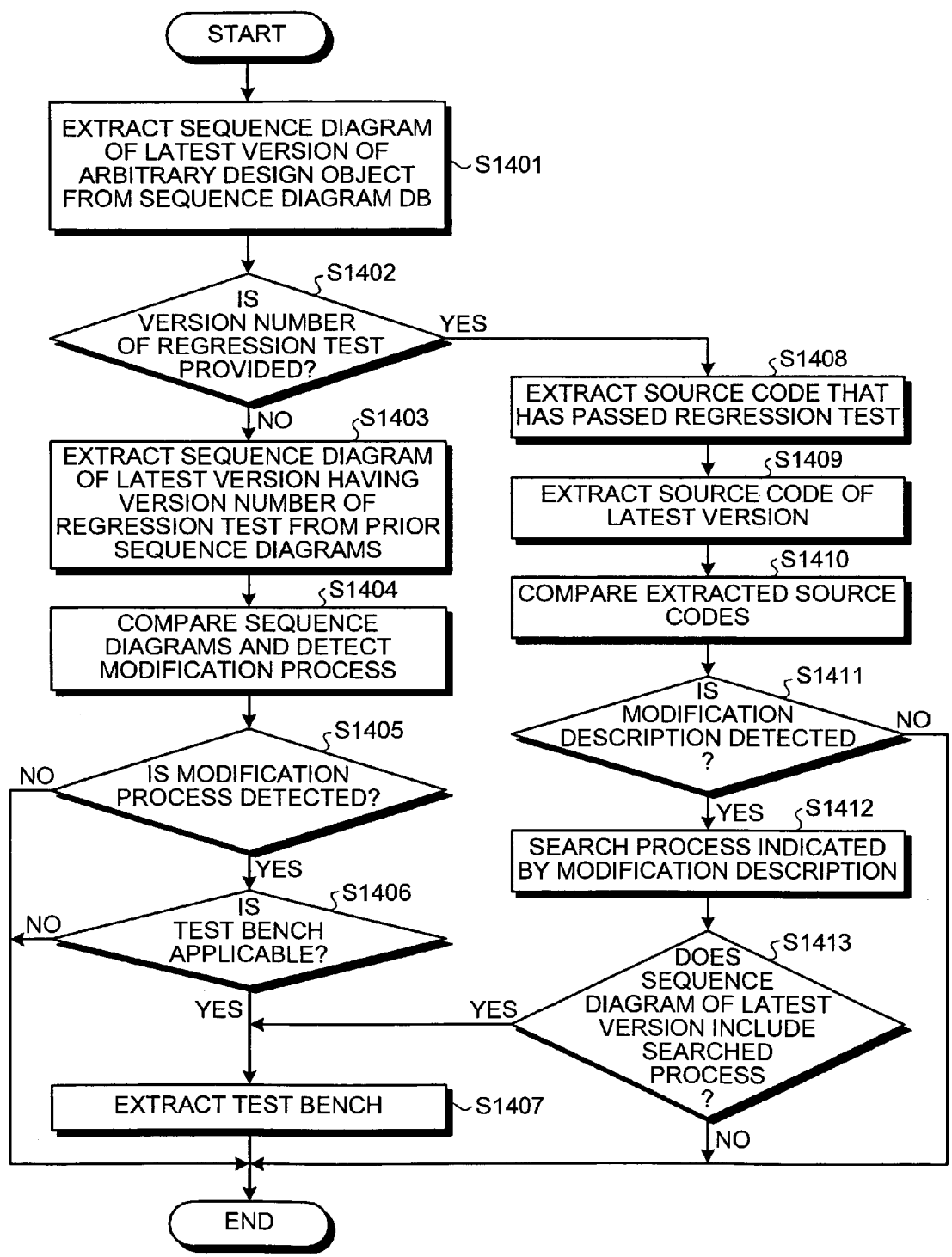
FIG. 14 is a flowchart of a test-bench search process shown in FIG. 11.

FIG. 14 is a flowchart of the test-bench search process of FIG. 11. As shown in FIG. 14, the sequence diagram of the latest version of an arbitrary design object is extracted (step S1401). And, whether the version number of the regression test is provided to the extracted sequence diagram is determined (step S1402).

If the version number of the regression test is not provided (step S1402: NO), the design object of the extracted sequence diagram is an unverified design object. Therefore, the sequence diagram with the latest version having the version number of the regression test is extracted (step S1403) from the sequence diagram with a version number prior to that of the extracted sequence diagram (sequence diagram before modification).

Next, a modified process is detected by comparing the extracted sequence diagrams (step S1404). If a modified process is not detected (step S1405: NO), a series of the procedure is terminated. If a modified process is detected (step S1405: YES), whether the test bench used for the design object of the sequence diagram with a prior version number can be applied is determined (step S1406), referring to the sequence diagram-test bench correspondence table 106 of FIG. 5.

If the test bench cannot be applied (step S1406: NO), a series of the procedure is terminated. In this case, a user 801 updates the sequence diagram-test bench correspondence table 106 of FIG. 5, by upgrading the version of the test bench. On the other hand, if the test bench can be applied (step S1406: YES), the test bench that is determined to be able to be applied is extracted from the test bench database 105 (step S1407).

If the version number of the regression test is provided (step S1402: YES), the source codes indicating the design contents of the design object that passed the regression tests (logic verifications) are extracted (step S1408) from the source code group indicating the design contents of the design object of the sequence diagram of the latest version that passed the logic verifications, referring to the regression-test log database 108.

The source code of the latest version is extracted (step S1409) from the source code group indicating the design contents of the design object that are shown in the sequence diagram of the latest version that passed the logic verifications, referring to the source code database 107. Then, comparing the source codes extracted at the steps S1408 and S1409 (step S1410), a modification description is extracted (step S1411).

If the modification description is not detected (step S1411: NO), a series of the procedure is terminated. If the modification description is detected (step S1411: YES), a process shown by the detected modification description is detected from the sequence diagrams other than the sequence diagrams that indicate the design object that passed the regression tests (step S1412).

Then, whether the sequence diagram of the latest version that is extracted at the step S1401 includes the process detected at the step S1412 is determined (step S1413). If the sequence diagram of the latest version that is extracted at the step S1401 does not include the process detected by the process searching unit 1026 (step S1413: NO), a series of the procedure is terminated. On the other hand, if the sequence diagram of the latest version that is extracted at the step S1401 includes the process detected by the process searching unit 1026 (step S1413: YES), the test benches corresponding to the sequence diagram that includes the process detected at the step S1412 are extracted (step S1407), referring to the sequence diagram-test bench correspondence table 106 of FIG. 5.

Figure 15:
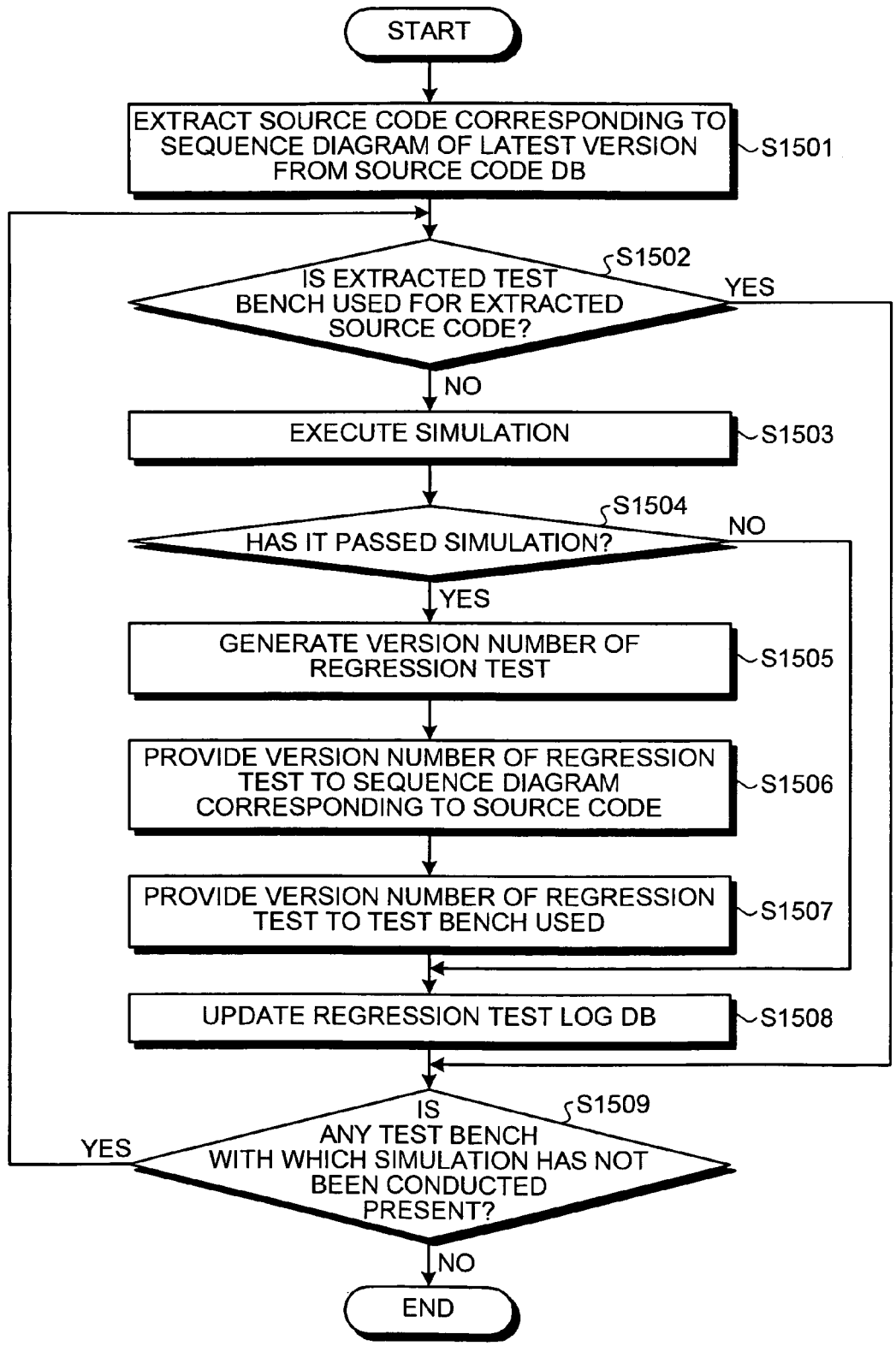
FIG. 15 is a flowchart of an (n+1)-th degree regression test.

FIG. 15 is a flowchart of the regression test procedure of n+1 sequence. As shown in FIG. 15, a source code corresponding to the sequence diagram of the latest version is extracted from the source code database 107 (step S1501). Then, whether the extracted test bench is already used for the extracted source code is determined (step S1502). If it is already used (step S1502: YES), it is moved to a step S1509. When it is not used (step S1502: NO), a simulation is conducted to verify an operation of the design object that is designed with the source code (step S1503), using the extracted test bench.

If the source code fails the simulation (step S1504: NO), it is moved to a S1508. On the other hand, if it passes the simulation (step S1504: YES), a version number of the regression test is generated (step S1505). Then the version number of the regression test is provided to the sequence diagram that corresponds to the source code (step S1506), and a version number of the regression test is provided to the test benches used (step S1507). And, the regression-test log database 108 is updated (step S1508).

If there is a test bench that has not conducted a simulation (step S1509: YES), it is moved to the step 1502. If there is no test bench that has not conducted a simulation (step S1509: NO), the regression test of n+1 sequence is terminated.

According to the verification support device 101 of the embodiment of the invention, since the modified process of the modified sequence diagram 301 can be detected from the sequence diagram 300 before modification, the designer, at the time of development n+1, can easily and efficiently detect the test benches that were used for the past development. Therefore, the time necessary for the verification operation can be considerably reduced, and efficient verification operation can be achieved. Further, since unnecessary test benches are not applied, useless regression tests are not conducted, and therefore, efficient verification operation can be achieved.

Even when modification of the sequence diagram is not necessary and only simple modification of the source codes is conducted, the modification descriptions can be detected by comparing the source codes. As a result, like mentioned above, at the time of development n+l, the designer can easily and efficiently detect the test benches that were used for the past development. Therefore, the time necessary for the verification operation can be considerably reduced, and efficient verification operation can be achieved.

The verification method described in the embodiments of the invention can be realized by executing the programs prepared in advance with such computers as personal computers, workstations, etc. These programs are recorded on computer-readable storage media such as a hard disk, a flexible disk, a CD-ROM, an MO, a DVD, etc. The programs can be transmission media that can be distributed through networks such as Internet.

As described above, the verification support device, the verification support method, the verification supporting program, and the recording medium of the present invention can detect the test benches used for the design object of the diagrams before modification just by inputting the diagrams after modification. And therefore, the verification support device, the verification support method, the verification supporting program, and the recording medium can support the verification operation by easily and effectively detecting the test benches that can be applied.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A verification support device that supports logic verification of a design object to which modification has been made, wherein processes of a first design object, processes of the design object before the modification, and processes of a second design object, processes of the design object after the modification, are expressed in a chronological order in a first diagram and a modified first diagram ("second diagram"), respectively, the verification support device comprising:

a receiving unit configured to receive the second diagram;

a detecting unit configured to detect, from among the processes, a modified process being a process corresponding to the modification to the design object, based on the first diagram and the second diagram;

an applicability determining unit configured to determine whether test benches used for logic verification of the first design object are applicable to the logic verification of the second design object, based on the modified process;

an output unit configured to output the test benches based on a result of determination by the applicability determining unit;

a generating unit configured to generate information on the logic verification conducted on the second design object; and a result determining unit configured to determine whether the second design object has passed or failed the logic verification, base on the information, wherein when the result determining unit determines that the second design object has failed the logic verification, the detecting unit is configured to detect the modified process by comparing the second diagram and the first diagram;

the applicability determining unit includes:

an extracting unit configured to extract, when the result determining unit determines that the second design object has passed the logic verification, a source code used for the logic verification conducted on the second design object and a modified source code obtained by modifying the source code, from a group of source codes expressing a design of the second design object;

a modification description detecting unit configured to detect a modified description to which modification is made in the modified source code modified by comparing the source code and the modified source code;

a process searching unit configured to search for a process expressed by the modified description from diagrams other than the diagrams of the second design object; and a process determining unit configured to determine whether the diagrams of the second design object include the searched process; and the output unit is configured to output test benches used for logic verification of the searched process, based on a result of determination by the process determining unit.

2. The verification support device according to claim 1, wherein the applicability determining unit includes an external entity detecting unit configured to detect an external entity that executes the modified process by inputting data, from a group of external entities in the second diagram, the external entities externally inputting data; and an external entity determining unit configured to determine whether the first diagram includes the detected external entity, wherein the applicability determining unit is configured to determine whether the test benches used for the logic verification of the first design object are applicable to the logic verification of the second design object, based on a result of determination by the external entity determining unit.

3. A verification support method of supporting logic verification of a design object to which modification has been made, wherein processes of a first design object, processes of the design object before the modification, and processes of a second design object, processes of the design object after the modification, are expressed in a chronological order in a first diagram and a modified first diagram ("second diagram"), respectively, the verification support method comprising:

inputting the second diagram;

detecting, from among the processes, a modified process being a process corresponding to the modification to the design object, based on the first diagram and the second diagram;

determining whether test benches used for logic verification of the first design object are applicable to the logic verification of the second design object, based on the modified process;

outputting the test benches based on a result of determination at the determining;

generating information on the logic verification conducted on the second design object;

determining whether the second design object has passed or failed the logic verification, base on the information, and, when it is determined that the second design object has failed the logic verification, detecting the modified process by comparing the second diagram and the first diagram;

extracting when it is determined that the second design object has passed the logic verification, a source code used for the logic verification conducted on the second design object and a modified source code obtained by modifying the source code, from a group of source codes expressing a design of the second design object;

detecting a modified description to which modification is made in the modified source code modified by comparing the source code and the modified source code;

searching for a process expressed by the modified description from diagrams other than the diagrams of the second design object that has passed the logic verification; and determining whether the diagrams of the second design object include the searched process, wherein the outputting includes outputting test benches used for logic verification of the searched process, based on a result of determination at the determining whether the diagrams of the second design object include the searched process.

4. The verification support method according to claim 3, wherein the determining includes detecting an external entity that executes the modified process by inputting data, from a group of external entities in the second diagram, the external entities externally inputting data;

determining whether the first diagram includes the detected external entity; and determining whether the test benches used for the logic verification of the first design object are applicable to the logic verification of the second design object, based on a result of determination at the determining whether the diagrams before the modification include the detected external entity.

5. A computer-readable recording medium that stores therein a computer program for supporting logic verification of a design object to which modification has been made, wherein processes of a first design object, processes of the design object before the modification, and processes of a second design object, processes of the design object after the modification, are expressed in a chronological order in a first diagram and a modified first diagram ("second diagram"), respectively, the computer program making a computer execute:

inputting the second diagram;

detecting, from among the processes, a modified process being a process corresponding to the modification to the design object, based on the first diagram and the second diagram;

determining whether test benches used for logic verification of the first design object are applicable to the logic verification of the second design object, based on the modified process;

outputting the test benches based on a result of determination at the determining;

generating information on the logic verification conducted on the second design object;

determining whether the second design object has passed or failed the logic verification, base on the information, and, when it is determined that the second design object has failed the logic verification, detecting the modified process by comparing the second diagram and the first diagram;

extracting when it is determined that the second design object has passed the logic verification, a source code used for the logic verification conducted on the second design object and a modified source code obtained by modifying the source code, from a group of source codes expressing a design of the second design object;

detecting a modified description to which modification is made in the modified source code modified by comparing the source code and the modified source code;

searching for a process expressed by the modified description from diagrams other than the diagrams of the second design object; and determining whether the diagrams of the second design object include the searched process, wherein the outputting includes outputting test benches used for logic verification of the searched process, based on a result of determination at the determining whether the diagrams of the second design object include the searched process.

6. The computer-readable recording medium according to claim 5, wherein the determining includes detecting an external entity that executes the modified process by inputting data, from a group of external entities in the second diagram, the external entities externally inputting data;

determining whether the first diagram includes the detected external entity; and determining whether the test benches used for the logic verification of the first design object are applicable to the logic verification of the second design object, based on a result of determination at the determining whether the diagrams before the modification include the detected external entity.

* * * * *